(12) United States Patent
Kim

(10) Patent No.: US 7,282,955 B2
(45) Date of Patent: Oct. 16, 2007

(54) SEMICONDUCTOR MEMORY DEVICE WITH ON-DIE TERMINATION CIRCUIT

(75) Inventor: Yong-Mi Kim, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 148 days.

(21) Appl. No.: 11/070,367

(22) Filed: Mar. 1, 2005

(65) Prior Publication Data

US 2006/0091901 A1    May 4, 2006

(30) Foreign Application Priority Data

Nov. 1, 2004  (KR) .................. 10-2004-0087875

(51) Int. Cl.
*H03K 19/0175*  (2006.01)

(52) U.S. Cl. .................. 326/87; 326/30; 326/83

(58) Field of Classification Search .......... 326/26, 326/27, 30, 82–87
See application file for complete search history.

(56) References Cited

U.S. PATENT DOCUMENTS

| | | | |
|---|---|---|---|
| 6,249,142 B1 | 6/2001 | Hall et al. | |
| 6,424,170 B1 | 7/2002 | Raman et al. | |
| 6,807,650 B2 | 10/2004 | Lamb et al. | |
| 6,856,164 B2 | 2/2005 | Park et al. | |
| 2004/0100837 A1 | 5/2004 | Lee | |
| 2004/0116703 A1 | 6/2004 | Peters et al. | |
| 2004/0141391 A1 | 7/2004 | Lee et al. | |
| 2004/0189343 A1 | 9/2004 | Jang | |
| 2004/0217774 A1* | 11/2004 | Choe | 326/30 |
| 2005/0046442 A1 | 3/2005 | Song | |
| 2005/0225353 A1* | 10/2005 | Kwon | 326/30 |
| 2006/0044008 A1* | 3/2006 | Miyake et al. | 326/30 |

FOREIGN PATENT DOCUMENTS

| | | |
|---|---|---|
| JP | 7-46104 | 2/1995 |
| JP | 8-335871 | 12/1996 |
| JP | 08-335871 | 12/1996 |
| KR | 2002-0066841 | 8/2002 |
| KR | 10-2004-0055879 | 6/2004 |

OTHER PUBLICATIONS

Korean Office Action with English translation for KR Patent Application No. 2004-87875, Feb. 17, 2006.

* cited by examiner

*Primary Examiner*—Don Le
(74) *Attorney, Agent, or Firm*—Blakely Sokoloff Taylor & Zafman

(57) ABSTRACT

An on-die termination circuit with a stable effective termination resistance value and stabilized impedance mismatching. The on-die termination circuit includes: a decoding unit for decoding set values of an extended mode register set; an ODT output driver block including a plurality of output driver units connected in parallel with an output node for outputting an output signal and assigned with different resistance values; and a control signal generation block for generating a plurality of pull up and pull down control signals for turning on/off the plurality of output driver units in response to output signals of the decoding unit.

17 Claims, 7 Drawing Sheets

SEMICONDUCTOR MEMORY DEVICE WITH ON-DIE TERMINATION CIRCUIT

FIELD OF THE INVENTION

The present invention relates to a semiconductor memory device; and, more particularly, to a semiconductor memory device with an on-die termination circuit capable of obtaining an intended level of termination resistance regardless of changes in process, voltage and temperature.

DESCRIPTION OF RELATED ARTS

Various semiconductor devices, for instance, a central processing unit (CPU), a memory, a gate array and so forth, that are implemented as integrated chips are incorporated into electrical products such as personal computers, servers, workstations and the like. In most cases, the semiconductor device includes an input circuit for receiving a variety of signals from an external circuit through input pads and an output circuit for providing internal signals to the external circuit through output pads.

Meanwhile, as operational speed of electrical products is accelerated, swing widths of signals interfaced between the semiconductor devices has been gradually decreased to minimize a delay time with respect to a signal transmission. However, as the swing widths of signals have been decreased, the signals are more increasingly prone to noises generated from external devices and are severely reflected because of impedance mismatching at an interface terminal. The impedance mismatching arises due to external noises and various changes in voltage, temperature and process. The impedance mismatching makes it difficult to transmit data at high speed and causes data outputted from an output terminal to be distorted. Therefore, when the semiconductor device disposed in the input circuit receives the distorted signal, there may be frequently arising problems of set-up/hold fail and misdetection in an input level.

Therefore, the semiconductor device in the input circuit requiring a high operational speed adopts an impedance matching circuit disposed adjacent to pads of the integrated chip. At this time, the impedance matching circuit is called an on-chip termination circuit or on-die termination circuit. Typically, for a scheme of the on-die termination circuit, a source termination occurs at a transmission side by an output circuit, while a parallel termination with respect to the input circuit connected with the input pads occurs at a receiving side by a termination circuit connected in parallel.

FIG. 1 is a block diagram showing an on-die termination (ODT) circuit of a conventional semiconductor memory device.

As shown, the conventional on-die termination circuit includes a decoding unit 10, a control signal generation block 20 and an ODT output driver block 30. The decoding unit 10 decodes set values of an extended mode register set (EMRS). The control signal generation block 20 generates control signals, i.e., a first to a third pull up control signals ODT_PU<1:3> and a first to a third pull down control signals ODT_PD<1:3>, for turning on and turning off a first to a third output driver units 32, 34 and 36 in response to a first to a third control signal S0, S1 and S2 from the decoding unit 10. The ODT output driver block 30 adjusts a termination resistance value in response to the first to the third pull up control signals ODT_PU<1:3> and the first to the third pull down control signals ODT_PD<1:3>. The ODT output driver block 30 is connected in parallel with an output node N1 for the purpose of adjusting the termination resistance value and includes the first to the third output driver units 32, 34 and 36 having the same resistance value.

Each of the first to the third output driver units 32, 34 and 36 includes one pull up driver and one pull down driver. Reference numerals 32A, 32B, 34A, 34B, 36A and 36B denote a first pull up driver, a first pull down driver, a second pull up driver, a second pull down driver, a third pull up driver and a third pull down driver, respectively. The first to the third pull up drivers 32A, 34A and 36A include one type of metal oxide semiconductor (MOS) transistors, i.e., P-channel metal oxide semiconductor (PMOS) transistors or N-channel metal oxide semiconductor (NMOS) transistors and serve a role in driving the output node N1 in a pull up mode in response to the first to the third pull up control signals ODT_PU<1:3>. Identically, the first to the third pull down drivers 32B, 34B and 36B include one type of the MOS transistors and serve a role in driving the output node N1 in a pull down mode in response to the first to the third pull down control signal ODT_PD<1:3>.

Herein, the first to the third output driver units 32, 34 and 36 have the same circuit structure, and thus, the first output driver unit 32 will be described as an exemplary structure.

FIG. 2 is an inner circuit diagram showing the first output driver unit shown in FIG. 1. Herein, the same configuration elements are denoted with the same reference numerals used in FIG. 1.

As shown, the first pull up driver 32A of the first output driver unit 32 includes a plurality of PMOS transistors, i.e., a first to a fourth PMOS transistors PM1 to PM4 and a pull up resistor R1. At this time, the first pull up control signal ODT_PU<1> is inputted to each gate of the first to the fourth PMOS transistors PM1 to PM4 and each source of the first to the fourth PM1 to PM4 is connected with a first power voltage VDDQ. Also, the pull up resistor R1 is allocated between the output node N1 and a commonly connected drain node of the first to the fourth PMOS transistors PM1 to PM4.

The first pull down driver 32B includes a plurality of NMOS transistors, i.e., a first to a fourth NMOS transistors NM1 to NM4 and a pull down resistor R2. At this time, the first pull down control signal ODT_PD<1f> is inputted to each gate of the first to the fourth NMOS transistors NM1 to NM4 and each source of the first to the fourth NMOS transistors NM1 to NM4 is connected with a second power voltage VSSQ. Also, the pull down resistor R2 is allocated between the output node N1 and a commonly connected drain node of the first to the fourth NMOS transistors NM1 to NM4.

As described above, the first to the third output driver units 32, 34 and 36 of the ODT output driver block 30 have the commonly shared output node N1. That is, the first to the third output driver units 32, 34 and 36 are connected with the output node N1 in parallel.

Therefore, as the number of the output driver units that are turned on in response to the first to the third pull up control signals ODT_PU<1:3> and the first to the third pull down control signals ODT_PD<1:3> increases, the number of the resistors connected in parallel increases proportionally and as a result, a termination resistance value becomes smaller. On the contrary, as the number of the output driver units that are turned on decreases, the termination resistance value becomes greater.

A user can set a termination resistance value to be one of 50Ω, 75Ω and 150Ω through using a set value of the EMRS. Hereinafter, the termination resistance value will be described in detail in consideration of turn-on resistance values of the first to the third output driver units 32, 34 and 36.

It is assumed that each turn-on resistance value of the first to the third output driver units 32, 34 and 36 is 150Ω, and when the first to the third output driver units 32, 34 and 36 are turned on, it is equivalent to three resistors, each with a resistance value of 150Ω connected in parallel. Thus, the termination resistance value is 50Ω. Also, under the same assumption, when two of the first to the third output driver units 32, 34 and 36 are turned on, it is equivalent to two resistors, each with a resistance value of 150Ω connected in parallel. Thus, the termination resistance value is 75Ω. When only one of the first to the third output driver units 32, 34 and 36 is turned on, the termination resistance value is 150Ω.

FIG. 3 is an inner circuit diagram showing the control signal generation block 20 illustrated in FIG. 1. The control signal generation block 20 includes a first to a third control signal generation unit 22, 24 and 26 for generating control signals each corresponding to respective output signals of the decoding unit 10. The first to the third control signal generation unit 22, 24 and 26 have the same circuit configuration, and thus, the first control signal generation unit 22 will be described as an example.

As shown in FIG. 3, the first control signal generation unit 22 includes: an inverter I1 for inverting a first output signal S0 from the decoding unit 10; a fifth PMOS transistor PM5 having a gate to which an output signal from the inverter I1 is inputted and a source-drain path formed between the first power voltage VDDQ and an output node for outputting the first pull up control signal ODT_PU<1>; a fifth NMOS transistor NM5 having a gate to which an output signal from the inverter I1 is inputted and a source-drain path formed between the second power voltage VSSQ and the output node; a sixth PMOS transistor PM6 having a gate to which the first output signal S0 from the decoding unit 10 is inputted and a source-drain path formed between the first power voltage VDDQ and another output node for outputting the first pull down control signal ODT_PD<1>; and a sixth NMOS transistor NM6 having a gate to which the first output signal S0 is inputted and a source-drain path formed between the second power voltage VSSQ and said another output node.

Table 1 provided below shows EMRS values and termination resistance values defined by the JEDEC specification.

TABLE 1

| A6 | A2 | Rtt (NOMINAL) |
| --- | --- | --- |
| 0 | 0 | ODT Disabled |
| 0 | 1 | 75 ohm |
| 1 | 0 | 150 ohm |
| 1 | 1 | 50 ohm |

With reference to Table 1, a procedure for setting the termination resistance value of the semiconductor memory device according to the EMRS values inputted by a user will be explained.

First, when A6 and A2 signals of the EMRS are inactivated by having a logic level of 'L', on the basis of the EMRS values, the decoding unit 10 inactivates the output signals, i.e., the first output signal S0, the second output signal S1 and the third output signal S2, to have the logic levels of 'H'. Therefore, the control signal generation block 20 inactivates the first to the third pull up control signals ODT_PU<1:3> to have the logic levels of 'H' and inactivates the first to the third pull down control signals ODT_PD<1:3> to have the logic levels of 'L'. As a result of the inactivation, the first to the third output driver units 32, 34 and 36 are turned off, resulting in the termination resistance value of 0Ω.

Also, when the A6 and the A2 signals of the EMRS have the logic level of 'L' and the logic level of 'H', respectively, the decoding unit 10 activates the first and the second output control signals S0 and S1 to have the logic levels of 'L'. In response to the first and the second output control signals S0 and S1, the control signal generation block 20 activates the corresponding pull up and pull down control signals among the first to the third pull up control signals ODT_PU<1:3> and the first to the third pull down control signals ODT_PD<1:3>, i.e., the first to the second pull up control signals ODT_PU<1:2> and the fist to the second pull down control signals ODT_PD<1:2>. As a result of the activation, the first and the second output driver units 32 and 34 are turned on, resulting in the termination resistance value of 75Ω.

Also, when the A6 and the A2 signals of the EMRS have the logic level of 'H' and the logic level of 'L', respectively, the decoding unit 10 activates the second output signal S1 to have the logic level of 'L'. Therefore, the control signal generation unit 20 activates the second pull up signal ODT_PU<2> and the second pull down signal ODT_PD<2>. This activation causes the second output driver unit 34 to be turned on, thereby resulting in the termination resistance value of 150Ω.

Lastly, when the A6 and the A2 signals of the EMRS have the logic levels of 'H', the decoding unit 10 activates the first to the third output signals S0 to S2, so that the control signal generation block 20 activates the first to the third pull up control signals ODT_PU<1:3> and the first to the third pull down control signals ODT_PD<1:3>. Thus, the first to the third output driver units 32, 34 and 36 are turned on, resulting in the termination resistance value of 50 Ω.

As described above, a user is able to set the termination resistance value to be one of 150 Ω, 75Ω and 50Ω through the combination of the activation and inactivation of the A2 and A6 signals.

Meanwhile, in addition to a range of error in an effective termination resistance value, the JEDEC specification defines a Rtt impedance mismatching representing a distortion between a resistance value of the PMOS transistors and the pull-up resistor and another resistance value of the NMOS transistors and the pull-down resistor.

However, a group of the pull up drivers for driving the output nodes of the output driver units in the on-die termination circuit is constructed in one type of MOS transistors, while another group of the pull down drivers for driving the output nodes of the output driver units is formed in another one type of MOS transistors. Thus, when there are changes in process, voltage and temperature, the PMOS transistors and the NMOS transistors exhibit different physical properties. As a result, it is difficult to control the termination resistance value as intended.

Because of the difference in physical properties of the PMOS and NMOS transistors, the impedance mismatching between the resistance value of the pull up driver and the pull up resistor and the resistance value of the pull down driver and the pull down resistor becomes severe. Therefore, there arises a problem that the semiconductor devices become defective because of failure in satisfying the JEDEC specification.

SUMMARY OF THE INVENTION

It is, therefore, an object of the present invention to provide an on-die termination circuit capable of obtaining a stable effective termination resistance value and stabilizing impedance mismatching between a resistance value of a pull up driver and a first resistor and another resistance value of a pull down driver and a second resistor regardless of changes in process, voltage and temperature.

In accordance with an aspect of the present invention, there is provided an on-die termination (ODT) circuit, including: a decoding unit for decoding set values of an extended mode register set (EMRS); an ODT output driver block including a plurality of output driver units connected in parallel with an output node for outputting an output signal and assigned with different resistance values; and a control signal generation block for generating a plurality of pull up and pull down control signals for turning on/off the plurality of output driver units in response to output signals of the decoding unit.

In accordance with another aspect of the present invention, there is provided a semiconductor memory device, including: a decoding unit for decoding set values of an extended mode register set (EMRS); an on-die termination (ODT) output driver block including a plurality of output driver units, each of the output driver units having: a pull up driver provided with different types of metal oxide semiconductor (MOS) transistors and driving an output node in a pull up mode in response to a pull up and a pull down control signals; and a pull down driver provided with different types of MOS transistors and driving the output node in a pull down mode in response to the pull up and the pull down control signals; and a control signal generation block for generating the pull up and pull down control signals for turning on/off the output driver units in response to output signals of the decoding unit.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor memory device with an on-die termination circuit in accordance with a preferred embodiment of the present invention will be described in detail with reference to the accompanying drawings.

Figure 1:
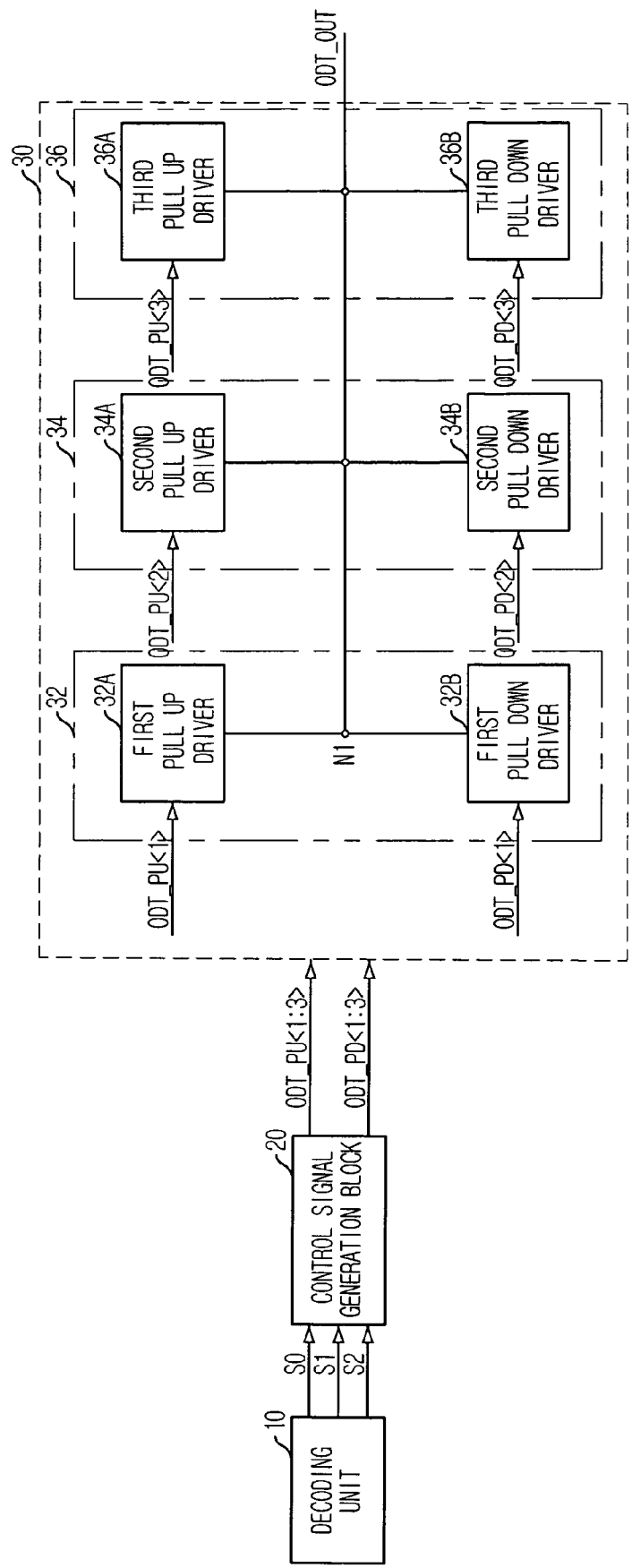
FIG. 1 is a block diagram showing an on-die termination circuit in a conventional semiconductor memory device.
Figure 2:
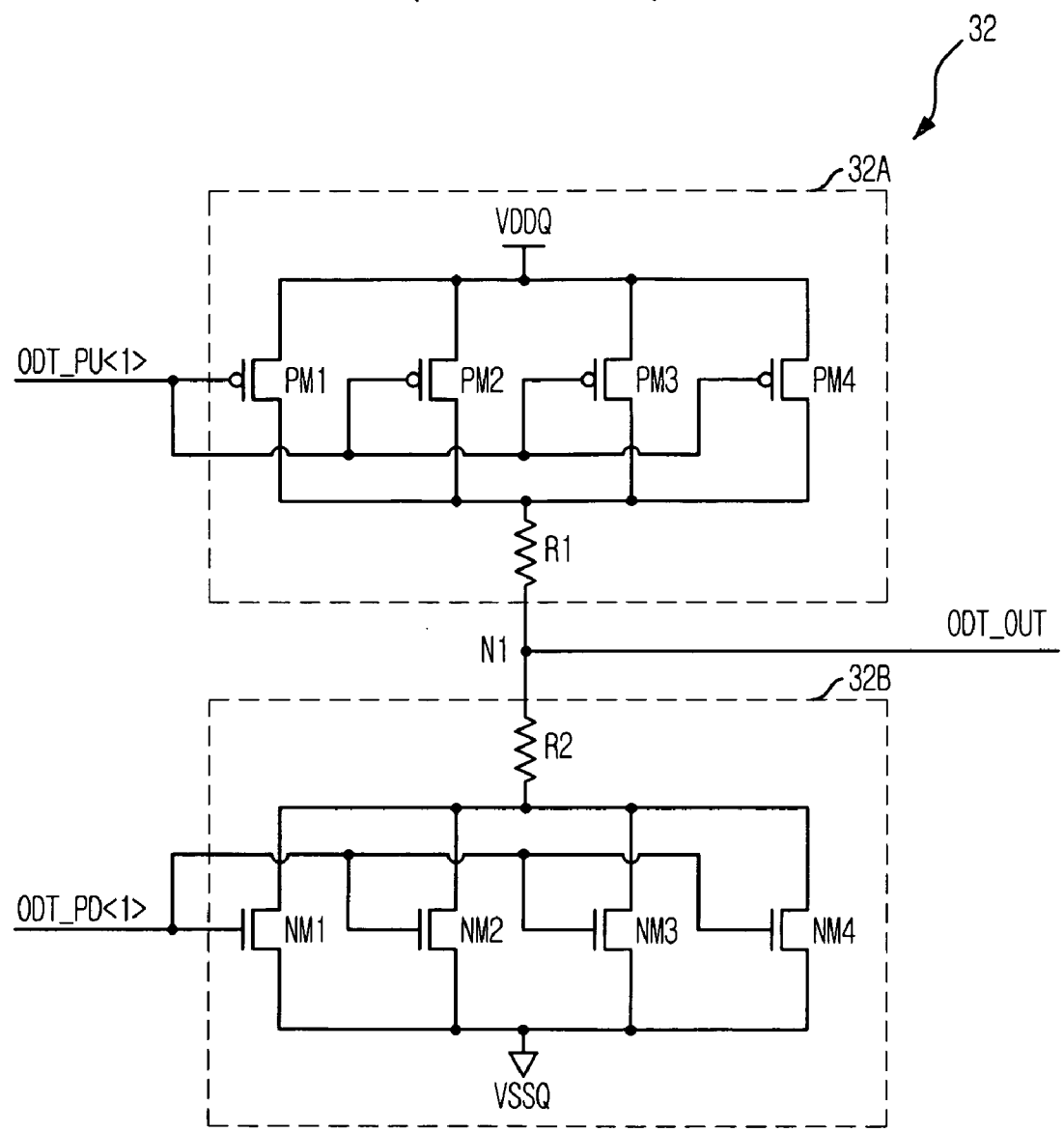
FIG. 2 is an inner circuit diagram showing a first output driver unit shown in FIG. 1.
Figure 3:
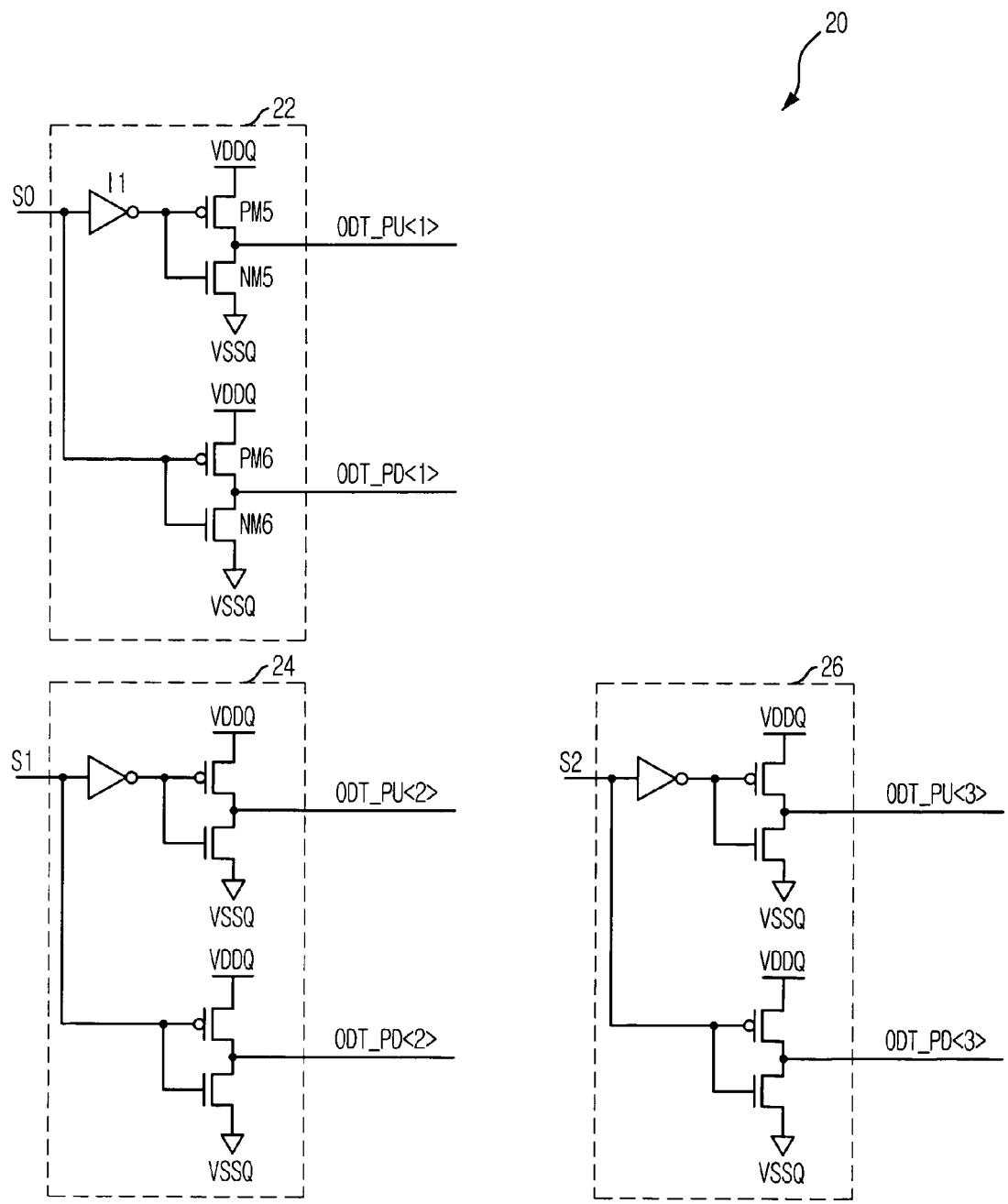
FIG. 3 is an inner circuit diagram showing a control signal generation block shown in FIG. 1.
Figure 4:
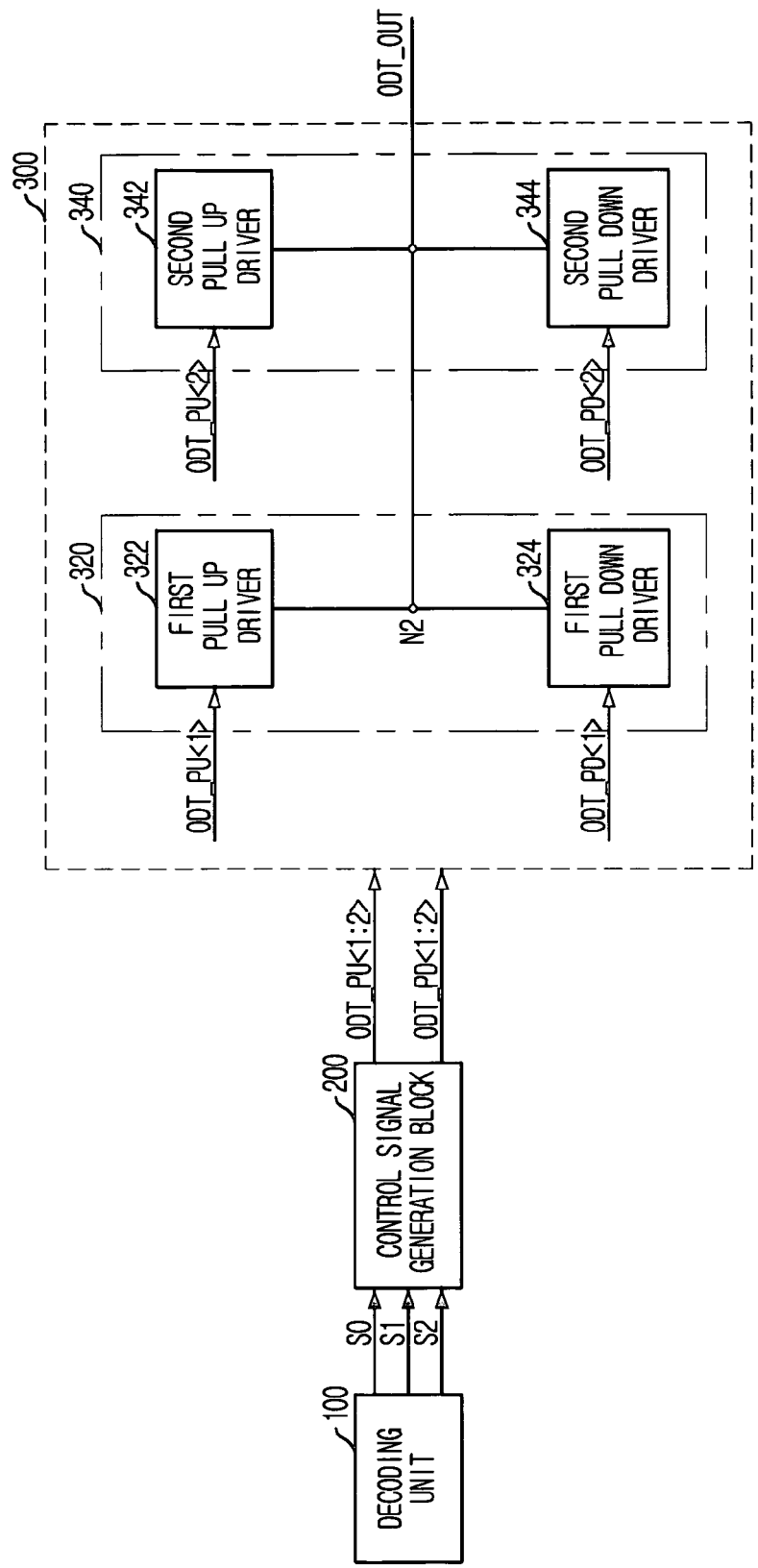
FIG. 4 is a block diagram showing an on-die termination circuit in a semiconductor memory device in accordance with a preferred embodiment of the present invention.

FIG. 4 is a block diagram showing an on-die termination circuit in a semiconductor memory device in accordance with a preferred embodiment of the present invention.

As shown, the on-die termination (ODT) circuit includes: a decoding unit 100; a control signal generation block 200; and an ODT output driver block 300. The decoding unit 100 decodes set values of an extended mode register set (EMRS). The ODT output driver block 300 includes a first and a second output driver units 320 and 340 each being connected in parallel with an output node N2 along with a different resistance value. The control signal generation block 200 generates a first and a second pull up control signals ODT_PU<1:2> and a first and a second pull down control signals ODT_PD<1:2> for turning on/off the plurality of output driver units 320 and 340 in response to a first to a third output signals S0, S1 and S2 of the decoding unit 100.

The first and the second output driver units 320 and 340 include: a first and a second pull up drivers 322 and 342; and a first and a second pull down drivers 324 and 344. More specifically, the first and the second pull up drivers 322 and 342 include different types of P-channel metal oxide semiconductor (PMOS) and N-channel metal oxide semiconductor (NMOS) transistors and serve a role in driving the output node N2 in a pull up mode in response to the first and the second pull up control signals ODT_PU<1:2>. Also, the first and the second pull down drivers 324 and 344 include different types of PMOS transistors and NMOS transistors and serve a role in driving the output node N2 in a pull down mode in response to the first and the second pull down control signals ODT_PD<1:2>.

Figure 5:
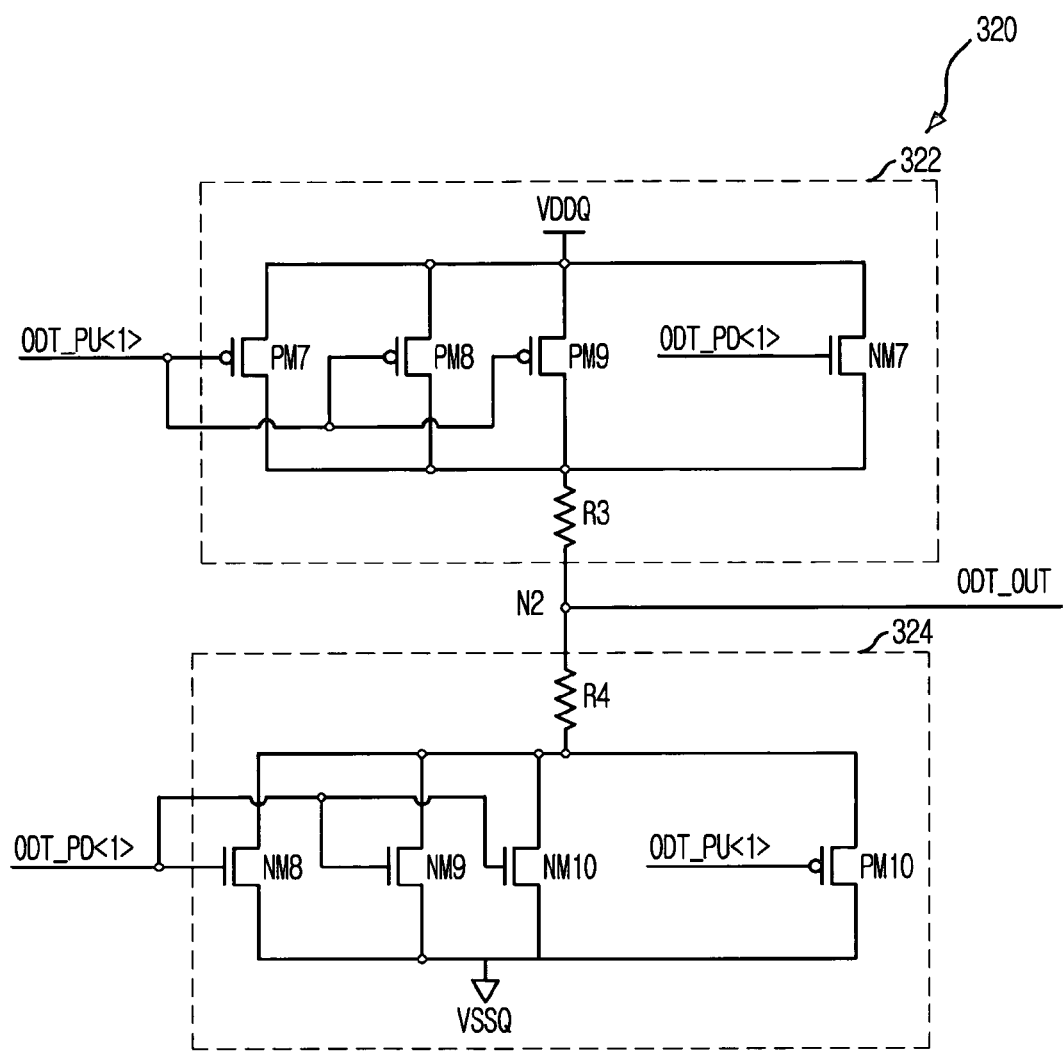
FIG. 5 is an inner circuit diagram showing a first output driver unit illustrated in FIG. 4.

FIG. 5 is an inner circuit diagram showing the first output driver unit illustrated in FIG. 4.

As shown, the first pull up driver 322 of the first output driver unit 320 includes: a plurality of PMOS transistors, i.e., a first to a third PMOS transistors PM7 to PM9; a pull up resistor R3; and a first NMOS transistor NM7. At this time, the first pull up control signal ODT_PU<1> is inputted to each gate of the first to the third PMOS transistors PM7 to PM9 and each source of the first to the third PM7 to PM9 is connected with a first power voltage VDDQ. Also, the pull up resistor R3 is allocated between the output node N2 and a commonly connected drain node of the first to the third PMOS transistors PM7 to PM9. Also, the first NMOS transistor NM7 indudes; a gate to which the first pull down control signal ODT PD<1> is inputted; a drain connected to the first power voltage VDDQ; and a source connected to the commonly connected drain node of the first to the third PMOS transistors PM7 to PM9.

The first pull down driver 324 of the first output driver unit 320 includes: a plurality of NMOS transistors, i.e., a second to a fourth NMOS transistors NM8 to NM10; a pull down resistor R4; and a fourth PMOS transistor PM10. At this time, the first pull down control signal ODT_PD<1> is inputted to each gate of the second to the fourth NMOS transistors NM8 to NM10, and each source of the second to the fourth NMOS transistors NM8 to NM10 is connected with a second power voltage VSSQ. Also, the pull down resistor R4 is allocated between the output node N2 and a commonly connected drain node of the second to the fourth NMOS transistors NM8 to NM10. The fourth PMOS transistor PM10 includes: a gate to which the first pull up control signal ODI PU<1> is inputted; a drain connected to the second power voltage VSSQ; and a source connected to the commonly connected drain node of the second to the fourth NMOS transistors NM8 to NM10. That is, each of the first pull up driver 322 and the first pull down driver 324 includes different types of MOS transistors.

Meanwhile, the first output driver unit 320 has a turn-on resistance value of approximately 75Ω, while the second output driver unit 340 has a turn-on resistance value of approximately 150Ω. Therefore, when only the first output driver unit 320 is turned on, the termination resistance value becomes approximately 75Ω, and when only the second output driver unit 340 is turned on, the termination resistance value becomes approximately 150Ω. When both of the first and the second output driver units 320 and 340 are turned on, the termination resistance value becomes approximately 50Ω.

As described above, the semiconductor memory device is constructed with the first and the second pull up drivers 322 and 342 and the first and the second pull down drivers 324 and 344 by employing both PMOS transistors and NMOS transistors. Therefore, even if a driving speed of the PMOS transistors becomes slower than that of the NMOS transistors because of changes in process, operation voltage and temperature (PVT), the NMOS transistors of the pull up drivers or the pull down drivers complement this slowed driving speed. As a result, the termination resistance value varies minimally. Also, there is not a distortion between a resistance value of the pull up path and a resistance value of the pull down path, thereby satisfying Rtt impedance mismatching to be in an allowable range of the Rtt impedance mismatching.

Since the semiconductor memory device with the on-die termination circuit in accordance with the preferred embodiment of the present invention is stable to the PVT changes, it is possible to improve reliability of chips and obtain the scaled-down chip size.

Figure 6:
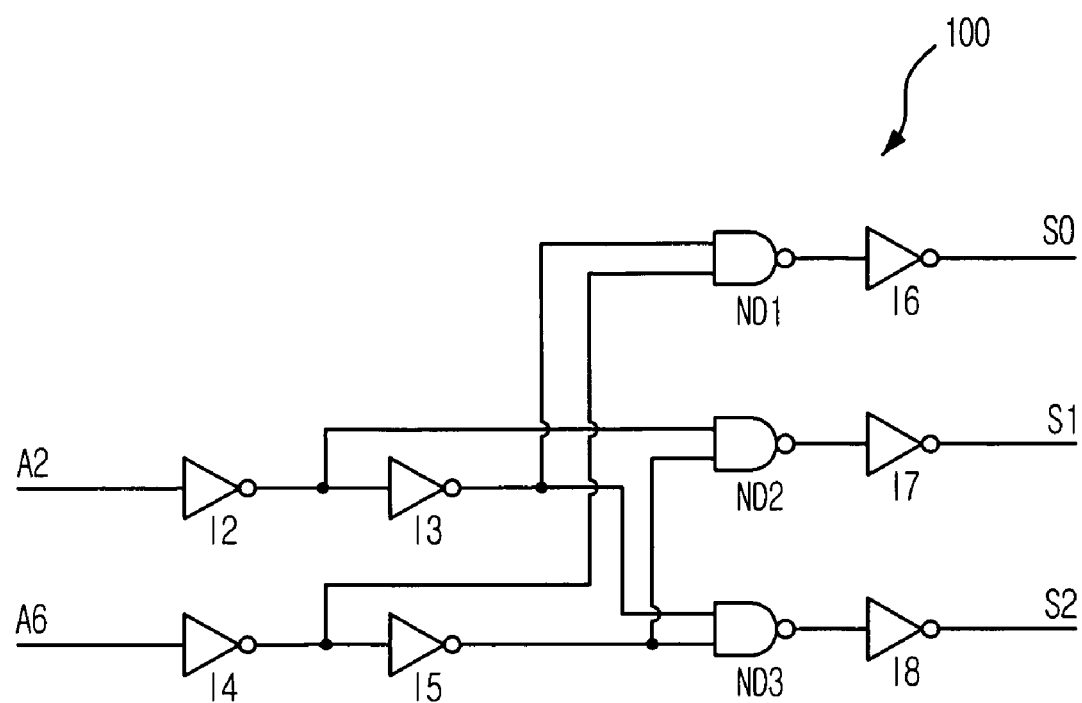
FIG. 6 is an inner circuit diagram showing a decoding unit illustrated in FIG. 4.

FIG. 6 is an inner circuit diagram showing the decoding unit of FIG. 4.

As shown, the decoding unit 100 includes a plurality of inverters and a plurality of NAND gates. More specifically, the decoding unit 100 includes: a first inverter I2 for inverting an A2 signal of the EMRS; a second inverter I3 for inverting an output signal of the first inverter I2; a third inverter I4 for inverting an A6 signal of the EMRS; a fourth inverter I5 for inverting an output signal of the third inverter I4; a first NAND gate ND1 to which output signals of the second and the third inverters I3 and I4 are inputted; a fifth inverter I6 for inverting an output signal of the first NAND gate ND1 to output the first output signal S0; a second NAND gate ND2 to which output signals of the first and the fourth inverters I2 and I5 are inputted; a sixth inverter I7 for inverting an output signal of the second NAND gate ND2 to output the second output signal S1; a third NAND gate ND3 to which output signals of the second and the fourth inverters I3 and I5 are inputted; and a seventh inverter I8 for inverting an output signal of the third NAND gate ND3 to output the third output signal S2.

Figure 7:
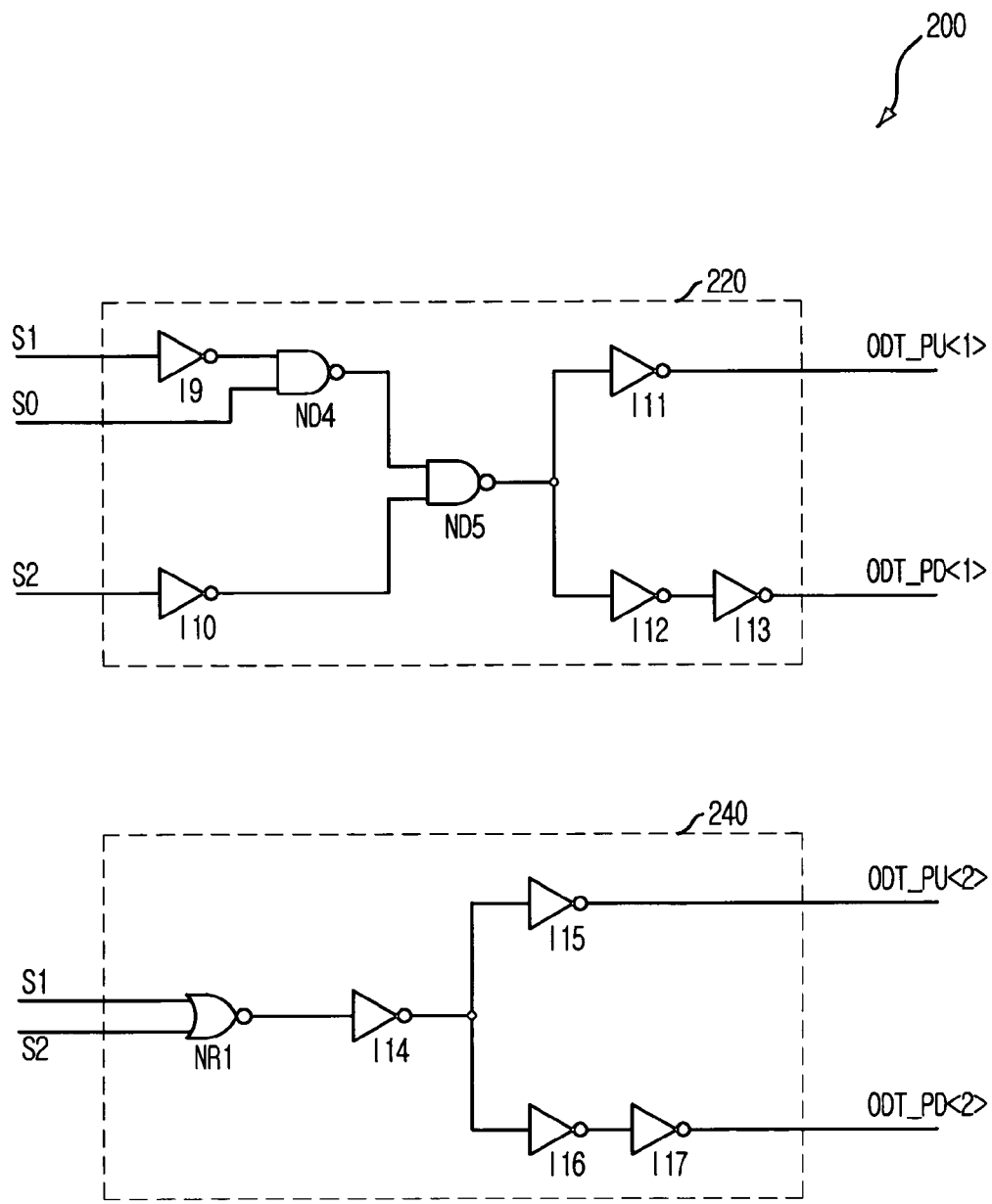
FIG. 7 is an inner circuit diagram showing a control signal generation block illustrated in FIG. 4.

FIG. 7 is an inner circuit diagram showing the control signal generation block illustrated in FIG. 4.

As shown, the control signal generation block 200 includes: a first control signal generation unit 220 for activating the first pull up control signal ODT_PU<1> and the first pull down control signal ODT_PD<1> when the first output signal S0 or the third output signal S2 of the decoding unit 100 is activated; and a second control signal generation unit 240 for activating the second pull up control signal ODT_PU<2> and the second pull down control signal ODT_PD<2> when the second output signal S1 or the third output signal S2 of the decoding unit 100 is activated.

The first control signal generation unit 220 includes: an eighth inverter I9 for inverting the second output signal S1 of the decoding unit 100; a fourth NAND gate ND4 to which an input signal of the eighth inverter I9 and the first output signal S0 are inputted; a ninth inverter I10 for inverting the third output signal S2 of the decoding unit 100; a fifth NAND gate ND5 to which output signals of the forth NAND gate ND4 and the ninth inverter I10 are inputted; a tenth inverter I11 for inverting an output signal of the fifth NAND gate ND5 to output the first pull up control signal ODT_PU<1>; and an inverter chain of an eleventh and a twelfth inverters I12 and I13 for delaying the output signal of the fifth NAND gate ND5 to output the first pull down control signal ODT_PD<1>.

The second control signal generation unit 240 includes: an NOR gate NR1 to which the second and the third output signals S1 and S2 are inputted; a thirteenth inverter I14 for inverting an output signal of the NOR gate NR1; a fourteenth inverter I15 for inverting an output signal of the thirteenth inverter I14 to output the second pull up control signal ODT_PU<2>; and an inverter chain of a fifteenth and a sixteenth inverters I16 and I17 for delaying the output signal of the thirteenth inverter I14 to output the second pull down control signal ODT_PU<2>.

Hereinafter, a procedure for setting a termination resistance value of the semiconductor memory device based on the EMRS set values set by a user will be described.

First, as a user sets a predetermined value of the EMRS, the decoding unit 100 activates the first to the third output signals S0 to S2 according to the EMRS set value.

In more detail, when the A6 and the A2 signals of the EMRS are inactivated by having logic levels of 'L', the decoding unit 100 inactivates the first to the third output signals S0 to S2 to have logic levels of 'L'. When the A6 signal and the A2 signal have logic levels of 'L' and 'H', respectively, the first output signal is activated. When the A6 signal and the A2 signal have logic levels of 'H' and 'L', respectively, the second output signal S1 is activated. Also, when both of the A6 and the A2 signals are activated, the third output signal S2 is activated.

Next, the control signal generation block 200 activates the control signals, i.e., the first and the second pull up control signals ODT_PU<1:2> and the first and the second pull down control signals ODT_PD<1:2> in response to the first to the third output signals S0 to S2 of the decoding unit 100. As a result of the activation, the number of the output driver units that are to be turned on is adjusted to thereby determine a termination resistance value.

That is, when the first output signal of the decoding unit 100 is activated, the control signal generation block 200 activates the first pull up control signal ODT_PU<1> and the first pull down control signal ODT_PD<1>. As a result, the first output driver unit 320 is turned on, and at this time, the termination resistance value is set to be approximately 75Ω.

Also, when the second output signal S1 of the decoding unit 100 is activated, the control signal generation block 200 activates the second pull up control signal ODT_PU<2> and the second pull down control signal ODT_PD<2>. As a result, the second output driver unit 340 is turned on, and at this time, the termination resistance value is set to be approximately 150Ω.

Lastly, when the third output signal S2 of the decoding unit 100 is activated, the control signal generation block 200 activates the first and the second pull up control signals ODT_PU<1:2> and the first and the second pull down control signals ODT_PD<1:2>. As a result, the first and the second output driver units 320 and 340 are turned on, and at this time, the termination resistance value is set to be approximately 50Ω.

Since the semiconductor memory device with the on-die termination circuit in accordance with the present invention is constructed with the output driver units by employing different types of MOS transistors, it is possible to complement the difference in properties of the different types of MOS transistors caused by the PVT changes. Accordingly, a variation in an error of the termination resistance value caused by the PVT changes decreases, and a distortion between a resistance value between the pull up path and the pull up resistor and a resistance value between the pull down path and the pull down resistor also decreases. Thus, it is possible to easily satisfy the JEDEC specification and improve reliability of chips. Also, since the number of the output driver units can be reduced, the chip size can be reduced as well.

The present application contains subject matter related to the Korean patent application No. KR 2004-0087875, filed in the Korean Patent Office on Nov. 1, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An on-die termination (ODT) circuit, comprising:
 a decoding means for decoding set values of an extended mode register set (EMRS);
 an ODT output driver block including a plurality of output driver units connected in parallel with an output node for outputting an output signal; and
 a control signal generation means for generating a plurality of pull up and pull down control signals for turning on/off the plurality of output driver units in response to output signals of the decoding means,
 wherein each of the output driver units includes:
 a pull up driver having a first pull up driving sector controlled by a corresponding one of the pull up control signals and a second pull up driving sector controlled by a corresponding one of the pull down control signals; and
 a pull down driver having a first pull down driving sector controlled by the corresponding one of the pull down control signals and a second pull down driving sector controlled by the corresponding one of the pull up control signals.

2. The ODT circuit of claim 1, wherein:
 the pull down driver drives the output node in a pull down mode, the first and the second pull down driving sectors having different types of MOS transistors from each other, and
 the pull up driver drives the output node in a pull up mode, the first and the second pull up driving sectors having different types of metal oxide semiconductor (MOS) transistors from each other.

3. The ODT circuit of claim 2, wherein the first pull up and the second pull down driving sectors and the second pull up and the first pull down driving sectors include P-channel metal oxide semiconductor (PMOS) transistors and N-channel metal oxide semiconductor (NMOS) transistors, respectively.

4. The ODT circuit of claim 3, wherein the pull up driver includes:

the first pull up driving sector having a first to a third PMOS transistor each with a gate to which the corresponding one of the pull up control signals is inputted and a source connected with a first power voltage;
a pull up resistor allocated between a commonly connected drain node of the first to the third PMOS transistors and the output node; and
the second pull up driving sector having a first NMOS transistor with a gate to which the corresponding one of the pull down control signals is inputted, a drain connected with the first power voltage and a source connected with the commonly connected drain node of the first to the third PMOS transistors.

5. The ODT circuit of claim 4, wherein the pull down driver includes:
the first pull down driving sector having a second to a fourth NMOS transistors each with a gate to which the corresponding one of the pull down control signals is inputted and a source connected with the first power voltage;
a pull down resistor allocated between a commonly connected drain node of the second to the fourth NMOS transistors and the output node; and
the second pull down driving sector having a fourth PMOS transistor with a gate to which the corresponding one of the pull up control signals is inputted, a drain connected with a second power voltage and a source connected with the commonly connected drain node of the second to the fourth NMOS transistors.

6. The ODT circuit of claim 3, wherein the ODT output driver block includes two output driver units assigned with different resistance values.

7. The ODT circuit of claim 6, wherein the control signal generation means includes:
a first control signal generation unit for activating a first pull up control signal and a first pull down control signal when one of a first output signal and a third output signal of the decoding means is activated; and
a second control signal generation unit for activating a second pull up control signal and a second pull down control signal when one of a second output signal and the third output signal of the decoding means is activated.

8. The ODT circuit of claim 7, wherein the first control signal generation unit includes:
a first inverter for inverting the first output signal;
a first NAND gate to which an output signal of the first inverter and the first output signal are inputted;
a second inverter for inverting the third output signal;
a second NAND gate to which output signals of the first NAND gate and the second inverter are inputted;
a third inverter for inverting an output signal of the second NAND gate to output the first pull up control signal; and
a first inverter chain for delaying the output signal of the second NAND gate to output the first pull down control signal.

9. The ODT circuit of claim 8, wherein the second control signal generation unit includes:
a first NOR gate to which the second and the third output signals are inputted;
a fourth inverter for inverting an output signal of the first NOR gate;
a fifth inverter for inverting an output signal of the fourth inverter to output the second pull up control signal; and a second inverter chain for delaying the output signal of the fourth inverter to output the second pull down control signal.

10. The ODT circuit of claim 7, wherein the decoding means includes:
a first inverter for inverting a first set value;
a second inverter for inverting a second set value;
a third inverter for inverting an output signal of the first inverter;
a fourth inverter for inverting an output signal of the second inverter;
a first NAND gate to which an output signal of the third inverter and the output signal of the second inverter are inputted;
a second NAND gate to which the output signals of the first and the fourth inverters are inputted;
a third NAND gate to which the output signals of the third and the fourth inverters are inputted;
a fifth inverter for inverting an output signal of the first NAND gate to output the first output signal;
a sixth inverter for inverting an output signal of the second NAND gate to output the second output signal; and
a seventh inverter for inverting an output signal of the third NAND gate to output the third output signal.

11. A semiconductor memory device, comprising:
a decoding means for decoding set values of an extended mode register set (EMRS);
an on-die termination (ODT) output driver block including a plurality of output driver units, each of the output driver units having:
a pull up driver provided with different types of metal oxide semiconductor (MOS) transistors operating in response to a corresponding pull up and a corresponding pull down control signals, respectively, thereby driving an output node in a pull up mode; and
a pull down driver provided with different types of MOS transistors operating in response to the corresponding pull down and the corresponding pull up control signals, respectively, thereby driving the output node in a pull down mode; and
a control signal generation means for generating the pull up and the pull down control signals for turning on/off the output driver units in response to output signals of the decoding means.

12. The semiconductor memory device of claim 11, wherein each of the pull up driver and the pull down driver include both of PMOS and NMOS transistors.

13. The semiconductor memory device of claim 12, wherein the pull up driver includes:
a first to a third PMOS transistors each with a gate to which the corresponding pull up control signals is inputted and a source connected with a first power voltage;
a pull up resistor allocated between a commonly connected drain node of the first to the third PMOS transistors and the output node; and
a first NMOS transistor with a gate to which the corresponding pull down control signals is connected, a dram connected with the first power voltage and a source connected with the commonly connected drain node of the first to the third PMOS transistors.

14. The semiconductor memory device of claim 13, wherein the pull down driver indudes:
a second to a fourth NMOS transistors each with a gate to which the corresponding pull down control signals is inputted and a source connected with the first power voltage;
a pull down resistor allocated between a commonly connected drain node of the second to the fourth NMOS transistors and the output node; and
a fourth PMOS transistor with a gate to which the corresponding pull up control signals is inputted, a drain connected with a second power voltage and a source connected with the commonly connected drain node of the second to the fourth NMOS transistors.

15. The semiconductor memory device of claim 14, wherein the control signal generation means includes:
a first control signal generation unit for activating a first pull up control signal and a first pull down control signal when one of a first output signal and a third output signal of the decoding means is activated; and
a second control signal generation unit for activating a second pull up control signal and a second pull down control signal when one of a second output signal and the third output signal of the decoding means is activated.

16. The semiconductor memory device of claim 15, wherein the first control signal generation unit includes:
a first inverter for inverting the first output signal;
a first NAND gate to which an output signal of the first inverter and the first output signal are inputted;
a second inverter for inverting the third output control signal;
a second NAND gate to which output signals of the first NAND gate and the second inverter are inputted;
a third inverter for inverting an output signal of the second NAND gate to output the first pull up control signal; and
a first inverter chain for delaying the output signal of the second NAND gate to output the first pull down control signal.

17. The semiconductor memory device of claim 16, wherein the second control signal generation unit includes:
a first NOR gate to which the second and the third output signals are inputted;
a fourth inverter for inverting an output signal of the first NOR gate;
a fifth inverter for inverting an output signal of the fourth inverter to output the second pull up control signal; and
a second inverter chain for delaying the output signal of the fourth inverter to output the second pull down control signal.

* * * * *